US006377466B1

(12) United States Patent
Chen et al.

(10) Patent No.: US 6,377,466 B1
(45) Date of Patent: Apr. 23, 2002

(54) HEADER, A METHOD OF MANUFACTURE THEREOF AND AN ELECTRONIC DEVICE EMPLOYING THE SAME

(75) Inventors: Shiaw-Jong Steve Chen, Plano; Roger J. Hooey, Rockwall, both of TX (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/523,052

(22) Filed: Mar. 10, 2000

(51) Int. Cl.[7] .................................................. H05K 7/02

(52) U.S. Cl. ....................... 361/767; 361/761; 361/764; 361/768; 361/769; 361/808; 361/820; 439/69; 439/620; 174/52.5; 257/696

(58) Field of Search ................................ 361/728, 736, 361/746, 761, 764, 767, 768, 769, 771, 807, 808, 809, 820; 439/69, 81, 83, 620, 751; 257/668, 678, 691, 696, 701, 702; 174/52.1, 52.4, 52.5

(56) References Cited

U.S. PATENT DOCUMENTS 4,539,622 A * 9/1985 Akasaki ...................... 361/764
4,678,250 A * 7/1987 Romine et al. ............... 439/83
5,067,007 A * 11/1991 Kanji et al. ................. 257/701
5,241,456 A * 8/1993 Marcinkiewicz et al. ... 361/761
5,519,936 A * 5/1996 Andros et al. ............. 174/52.5
5,835,357 A * 11/1998 Swamy et al. .............. 361/764
6,014,318 A * 1/2000 Takeda ........................ 361/764

OTHER PUBLICATIONS

"Surface Mount Header Assembly Employs Capillary Action" Data Sheet by Zierick; 2 pg. , Aug. 18, 2000.

* cited by examiner

*Primary Examiner*—Jeffrey Gaffin
*Assistant Examiner*—John B. Vigushin

(57) ABSTRACT

A header containing a semiconductor die, method of manufacture thereof and electronic device employing the same. In one embodiment, the header includes first and second contacts, and an intermediate body. The intermediate body includes an insulated section interposed between the first and second contacts and has a cavity therein. The intermediate body also includes a semiconductor die, located within the cavity, adapted to condition a signal passing through at least a portion of the header.

21 Claims, 5 Drawing Sheets

HEADER, A METHOD OF MANUFACTURE THEREOF AND AN ELECTRONIC DEVICE EMPLOYING THE SAME

TECHNICAL FIELD OF THE INVENTION

The present invention is directed, in general, to electronic devices and, more specifically, to a header containing a semiconductor die, method of manufacture thereof and electronic device employing the same.

BACKGROUND OF THE INVENTION

Most contemporary electronic devices are assembled on a substrate (interchangeably referred to as printed wiring or circuit board). The electronic devices generally have a plurality of components mounted on the substrate that, in cooperation with one another, combine to make up an electronic circuit. In order to provide electrical connectivity between the components, the substrate will include multiple conductive traces that are etched in or printed on the substrate. While in some cases the electronic devices include a single electronic circuit formed on a single substrate, in most cases electronic devices include a number of electronic circuits, each formed on a separate substrate.

Regardless of the design of the electronic device, the electronic circuits include input and output connections employable to transmit signals therethrough. Less complex devices, such as portable radios, may have as few as two input connections (power and antenna) and a single output (the speaker), all of which may be hard-wired. In the case of more complex equipment, a number of signals may be transmitted through headers with a number of different paths for the input and output signals. In addition to transmitting signals through the headers, the signals frequently must be modified or conditioned for use by a companion circuit coupled thereto. For example, the output signal from one electronic circuit may have to undergo a frequency or phase adjustment to be employed by a recipient electronic circuit.

As the complexity of the electronic device is augmented, the number of conditioned signals transmitted between electronic circuits increases. As an example, power supply circuits employed to power the electronic devices are typically designed in a subassembly that incorporates a modular design. In many such subassemblies, the components of the power supply are distributed between two circuit boards. One circuit board includes the power train circuit and the other circuit board includes the control circuit of the power supply. In this type of configuration, the power supply has many (e.g., as many as fourteen) different features or functions that must be coordinated between the power train and the control circuit. In addition to the internal coordination of signals within the power supply itself, the power supply signals must be delivered in an integrated manner to the respective circuits of the electronic device that the power supply is powering.

A conventional method used to pass signals from one circuit board to another is a dual in-line surface mounted header. Because all the header does is provide a conduit to pass the signals, the signals must be conditioned to be useable by the recipient board, either before it is transmitted or after it is received. This means that a circuit board will have a number of components used for the sole purpose of conditioning signals being transferred from one circuit board to another. The additional components necessary to accomplish the task increase the component density and the size of the circuit boards as well as the electronic circuit complexity. Any reduction in the number of components located on the circuit board to fulfill a particular task means a corresponding reduction in the cost of manufacturing, from both a component cost and assembly cost viewpoint. Thus, it is a continuing goal of design and application engineers to reduce the total number of components required on a circuit board. In order to do this, every effort should be made to combine the functionality of multiple circuits into a fewer number of electronic circuits, whenever possible.

Accordingly, what is needed in the art is an electronic device that employs a header to perform the traditional conduit functionality, but, at the same time, is adapted to process signals passing therethrough.

SUMMARY OF THE INVENTION

To address the above-discussed deficiencies of the prior art, the present invention provides a header containing a semiconductor die, method of manufacture thereof and electronic device employing the same. In one embodiment, the header includes first and second contacts, and an intermediate body. The intermediate body includes an insulated section interposed between the first and second contacts and has a cavity therein. The intermediate body also includes a semiconductor die, located within the cavity, adapted to condition a signal passing through at least a portion of the header.

The present invention introduces, in one aspect, a header having a semiconductor die located within its body that conditions a signal passing through the header. This contrasts with prior art headers that only serve as simple interfaces to pass a signal from, for instance, a first electronic circuit located on a first substrate (or printed wiring board) to a second electronic circuit located on a second substrate. Because a signal from the first electronic circuit must frequently be conditioned (e.g., filtered, scaled) before it is used by the second electronic circuit, the present invention advantageously provides a semiconductor die embedded in the header to perform such functionality. For example, the output signal of the first electronic circuit may require synchronization before the signal can be used by the second electronic circuit. The present invention permits such synchronization to be performed via the header, by itself.

In one embodiment of the present invention, the header has a plurality of semiconductor dies located within the cavity. This is particularly advantageous because a number of signals can be conditioned as they pass through the header. In such instances, the intermediate body preferably includes a plurality of insulated sections to accommodate the corresponding plurality of semiconductor dies. Of course, any number of semiconductor dies may be incorporated into the header as an application dictates.

In one embodiment of the present invention, the semiconductor die is flip-chip mounted in the cavity in the insulated section of the intermediate body. In a related embodiment, the semiconductor die is die-attached and wire-bonded in the cavity. Any mechanism may be employed to mount the semiconductor die within the cavity.

In another embodiment of the present invention, at least one of the first or second contacts is a spring loaded header. In a related embodiment, at least one of the first or second contacts has a surface mount pad. Additionally, it may be particularly advantageous to include a plurality of first and second contacts to, for instance, accommodate a number of different signals. In view thereof, the header of the present invention may include a plurality of first and second contacts.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
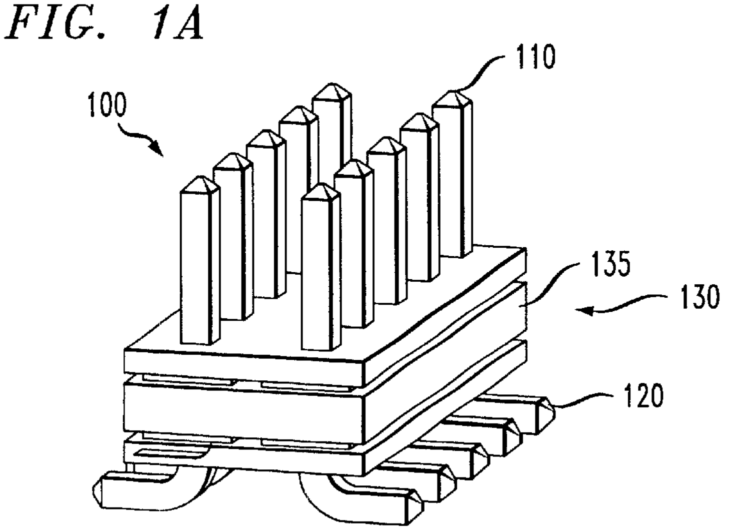
FIG. 1A illustrates an isometric view of an embodiment of a header constructed in accordance with the principles of the present invention.

Referring initially to FIG. 1A, illustrated is an isometric view of an embodiment of a header 100 constructed in accordance with the principles of the present invention. The header 100 includes a plurality of first contacts (one of which is designated and hereinafter referred to as a first contact 110) and a plurality of second contacts (one of which is designated and hereinafter referred to as a second contact 120) arranged in a dual in-line configuration. The header 100 further includes an intermediate body 130 having an insulated section 135 interposed between the first and second contacts 110, 120.

Figure 1B:
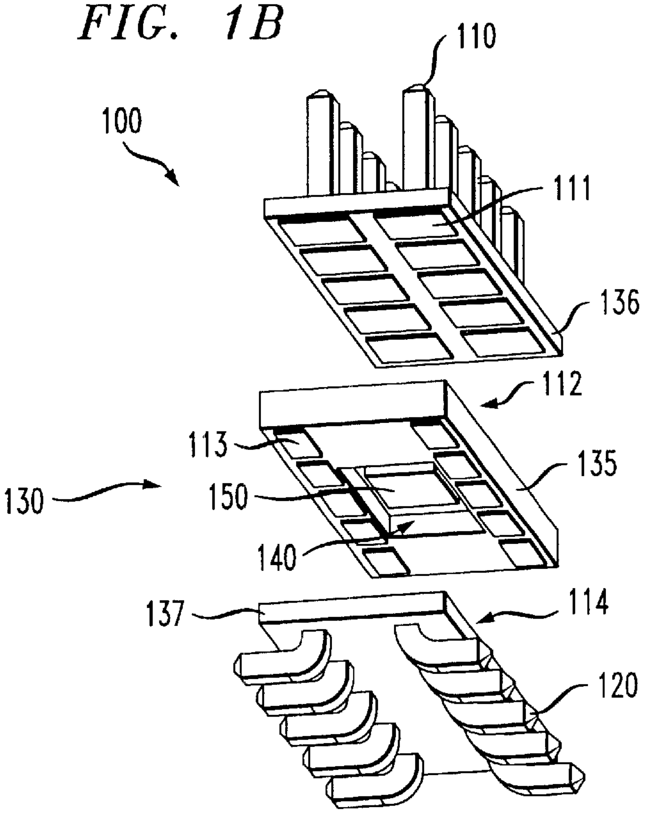
FIG. 1B illustrates an exploded isometric view of the header illustrated in FIG. 1A.

Turning now to FIG. 1B, illustrated is an exploded isometric view of the header 100 illustrated in FIG. 1A. The header 100 will be described with continuing reference to FIGS. 1A and 1B. Visible in the insulated section 135 of the intermediate body 130 is a cavity 140. Located within the cavity 140 is a semiconductor die 150 that is adapted to condition a signal passing through at least a portion of the header 100.

The present invention represents a substantial improvement over prior art electronic devices because it provides a header 100 with a semiconductor die 150, located within the intermediate body 130, that conditions the signal as it passes through the header 100. The header 100 is adapted to be attached to a substrate (printed wiring board) of an electronic device. The header 100 may substantially reduce the reliance on additional electrical components that may be mounted on the substrate for the sole purpose of processing or conditioning signals that pass through the header 100. Assume, for example, that the second contacts 120 are mounted on the substrate of the electronic device. The electronic device employing the header 100 may receive, via the first contacts 110, signals from another circuit of the electronic device. The signals are received through the header 100, wherein the signals may be modified, tested, regulated, or otherwise processed or conditioned before it leaves the header 100. Because the signals are conditioned within the header 100, real estate on the substrate that would be devoted to components that condition the signals may be made available to accommodate additional circuit components.

The placement of the semiconductor die 150 in the intermediate body 130 is also advantageous because the semiconductor die 150, in some cases, may be programable. This feature permits the semiconductor die 150 to be programed or re-programed on the fly. Such a configuration also permits the semiconductor die 150 to be remotely programable and permits features to be added, deleted or changed, depending on the user's needs.

For a better understanding of the present invention, a single signal will be traced as it passes through the header 100. In this example, it is assumed that the first contact 110 is connected to a first circuit within the electronic device (not shown) and that the second contact 120 is connected to a second circuit within the electronic device (not shown). A signal from the first circuit is delivered to the first contact 110 on the header 100, perhaps via a wiring system (e.g., ribbon cable). The signal passes through a first layer 136 of the intermediate body 130 to a first contact pad 111 that is in opposition to and electrically coupled to the first contact 110. The signal is then forwarded to a corresponding second contact pad 112 (not visible) on the insulated section 135 of the intermediate body 130 and then transferred to the semiconductor die 150 mounted in the cavity 140.

In the illustrated embodiment, the semiconductor die 150 is flip-chip mounted in the cavity 140. The insulated section 135, therefore, may have conductive traces therein that couple a portion of the semiconductor die 150 to the second contact pad 112. The semiconductor die 150 conditions the signal, with the type of conditioning dependent on the configuration or settings of the semiconductor die 150. Those skilled in the pertinent art will understand that the present invention encompasses all forms of conditioning (e.g., scaling, filtering, digital processing), whether now known or later discovered. The conditioned signal is then routed to a third contact pad 113 on the insulated section 135 where it is transferred to an associated fourth contact pad 114 (not visible) located on a second layer 137 of the intermediate body 130. In the illustrated embodiment, wherein the semiconductor die 150 is flip-chip mounted in the cavity 140, the insulated section 135 may further have conductive traces therein (e.g., another connector) that couple a portion of the semiconductor die 150 to the third contact pad 113. Opposing the fourth contact pad 114 is the second contact 120 that receives the conditioned signal and forwards it to the second circuit of the electronic device.

The illustrated header 100 has a plurality of first and second contacts 110, 120, each of which can be used to forward or receive signals. One embodiment of the present invention provides for a plurality of semiconductor dies 150 to be located in the cavity 140. Those skilled in the pertinent art will understand that a plurality of semiconductor dies 150 may be included as a single package (e.g., a multi-chip module) and mounted in the cavity 140. While the semiconductor die 150 is flip-chip mounted in the cavity 140, alternatively, the semiconductor die 150 may be die-attached and wire bonded in the cavity 140. Various methods of mounting the semiconductor die 150 are known to those skilled in the pertinent art and are well within the broad scope of the present invention.

Another beneficial feature of the present invention is that a signal received by one of the first and second contacts 110, 120 on the header 100 does not necessarily have to pass directly through the header 100 to an opposing contact 110, 120, as was usually the case in prior art headers. Because the signal is being routed through the semiconductor die 150 and, perhaps, the intermediate body 135, the semiconductor die 150 or the intermediate body 135 may be used to reroute a conditioned or unconditioned signal to any of the first and second contacts 110, 120 of the header 100. For example, a signal passing through the header 100 is input into the header 100 through a first contact 110 may be output through any of the first and second contacts 110, 120.

Figure 2A:
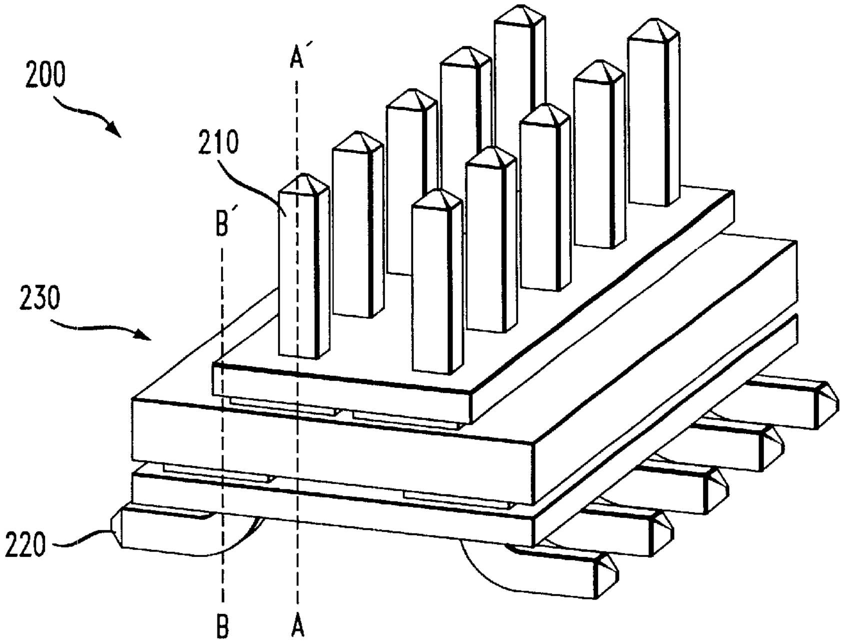
FIG. 2A illustrates an isometric view of another embodiment of a header constructed in accordance with the principles of the present invention.
Figure 2B:
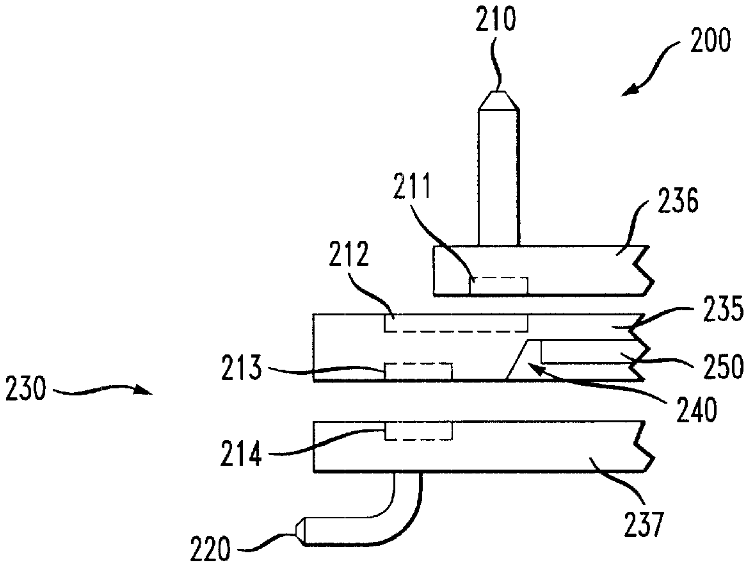
FIG. 2B illustrates an exploded cross sectional view of a portion of the header illustrated in FIG. 2A.

Turning now to FIG. 2A, illustrated is an isometric view of another embodiment of a header 200 constructed in accordance with the principles of the present invention. FIG. 2B illustrates an exploded cross sectional view of a portion of the header 200 illustrated in FIG. 2A. With continuing reference to FIGS. 2A and 2B, the header 200 includes a plurality of first contacts (one of which is designated and hereinafter referred to as a first contact 210) and a plurality of second contacts (one of which is designated and hereinafter referred to as a second contact 220). The header 200 further includes an intermediate body 230 interposed between the first and second contacts 210, 220.

In the illustrated embodiment, a line A–A' defines a first center line through the first contact 210 and the intermediate body 230. A second center line B–B' defines a center line through the second contact 220 and the intermediate body 230. The first and second center lines A–A', B–B' are offset from one another; that is, the pitch of the first contact 210 varies with respect to the pitch of the second contact 220.

The exploded cross sectional view of the header 200 in FIG. 2B illustrates one way to vary the pitch between the first and second contacts 210, 220. The signal from a first circuit of an electronic device (not illustrated) to which the first contact 210 is connected is received and passed through a first layer 236 of the intermediate body 230 to a first contact pad 211 in opposition to the first contact 210. The signal is then transferred to an associated second contact pad 212 on the insulated section 235 of the intermediate body 230. The foot print of the second contact pad 212 overlaps but does not match the footprint of the first contact pad 211 and, thereby, changes the pitch as the signal proceeds through the header 200.

After the signal is conditioned by a semiconductor die 250, located in a cavity 240 in the insulated section 235, it is delivered to a third contact pad 213 in the insulated section 235. The third contact pad 213 is associated with a fourth contact pad 214 on a second layer 237 of the intermediate body 230. The conditioned signal is then passed through the second layer 237 to the second contact 220 and then on to a second circuit of the electronic device (not illustrated) to which the second contact 220 is connected. Because the contact pads 211–214 do not completely overlap as the signal makes its way through the header 200, the pitch of the first and second contacts 210, 220 can be varied by changing the position and degree of overlap of the pads 211–214 with respect to each other. Of course, other mechanisms to vary the pitch may be employed to advantage.

Figure 3A:
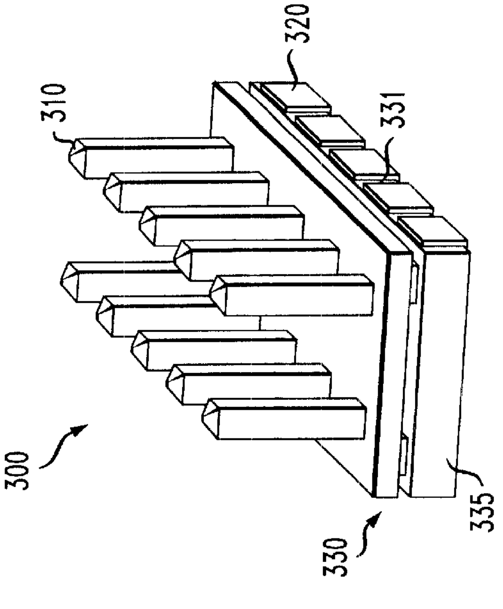
FIG. 3A, illustrates an isometric view of another embodiment of a header constructed in accordance with the principles of the present invention.
Figure 3B:
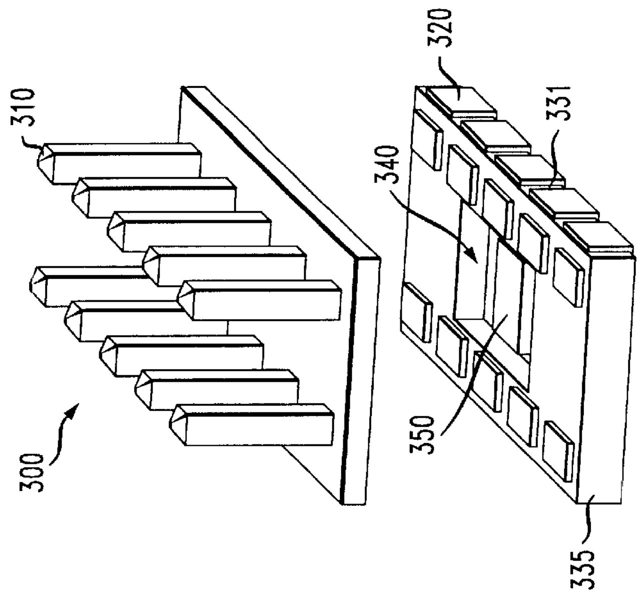
FIG. 3B illustrates an exploded isometric view of the header illustrated in FIG. 3A.
Figure 3C:
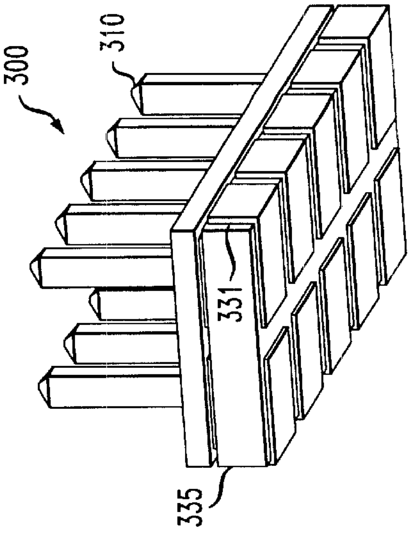
FIG. 3C illustrates another isometric view of the header illustrated in FIG. 3A.

Turning now to FIG. 3A, illustrated is an isometric view of another embodiment of a header 300 constructed in accordance with the principles of the present invention. The header 300 is employable as a low profile mount on a substrate (printed wiring board) of an electronic device. FIG. 3B illustrates an exploded isometric view of the header 300 illustrated in FIG. 3A. FIG. 3C illustrates another isometric view of the header 300 illustrated in FIG. 3A.

With continuing reference to FIGS. 3A, 3B, 3C, the header 300 includes a plurality of first contacts (one of which is designated and hereinafter referred to as a first contact 310) and a plurality of second contacts (one of which is designated and hereinafter referred to as a second contact 320). The header 300 further includes an intermediate body 330 having an insulated section 335 interposed between the first 310 and second 320 contacts. The intermediate body 330 further has a semiconductor die 350 located within a cavity 340 in the intermediate body 330. The header 300 is analogous to the headers 100, 200 illustrated and described above in FIGS. 1A–2B. A major difference between the header 300 illustrated in FIGS. 3A–3C and the headers 100, 200 previously illustrated and described, is that the second contact 320 is constructed as a surface mount pad.

By constructing the second contact 320 as a surface mount pad, the header 300 can be mounted flush with the surface of a circuit board. This permits the lower profile mount that is desirable in compact electronics devices. Another advantageous feature of the header 300 is that the second contact 320 can be configured so that it extends around to an edge 331 of the insulated section 330. This feature permits a manufacturer to easily inspect the header 300 connections after the header 300 is mounted. While the illustrated embodiment shows only the second contacts 320 as being surface mountable, those skilled in the pertinent art will realize that the first contacts 310 may also be surface mountable as required by a particular application.

Figure 4A:
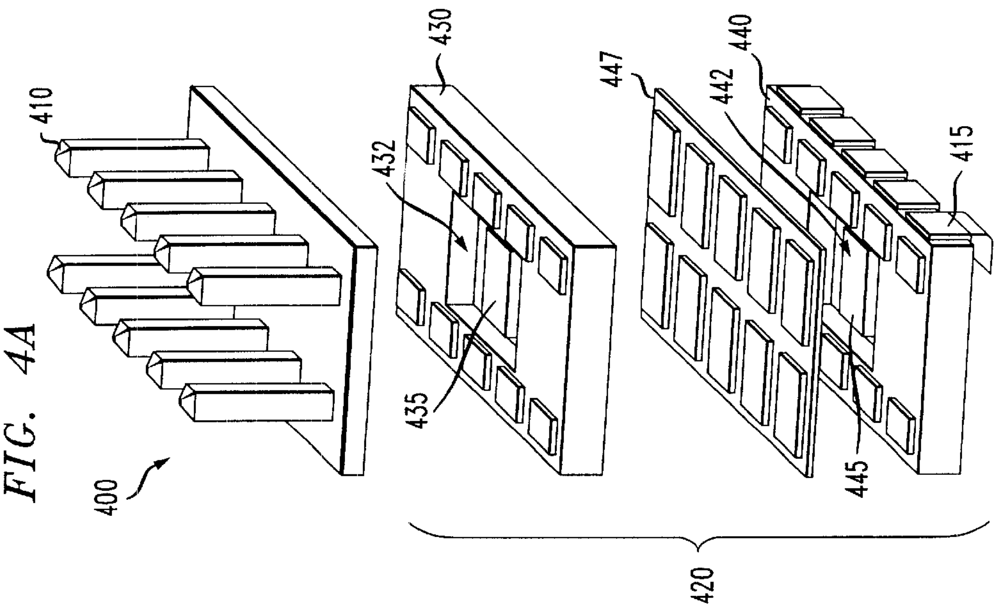
FIG. 4A illustrates an exploded isometric view of another embodiment of a header constructed in accordance with the principles of the present invention.

Turning now to FIG. 4A, illustrated is an exploded isometric view of another embodiment of a header 400 constructed in accordance with the principles of the present invention. The header 400 includes a plurality of first contacts (one of which is designated and hereinafter referred to as a first contact 410), a plurality of second contacts (one of which is designated and hereinafter referred to as a second contact 415) and an intermediate body 420. In the illustrated embodiment, the intermediate body 420 includes a first insulated section 430 coupled to a second insulated section 440. The first insulated section 430 has a first cavity 432 within which a first semiconductor die 435 is located. The second insulated section 440 has a second cavity 442 within which a second semiconductor die 445 is located. The first and second insulated sections 430, 440 are coupled together with an intermediate layer 447 interposed therebetween.

In the illustrated embodiment, the second contact 415 is a spring loaded connector. This is an advantageous feature because it assures that a positive connection can be made between the second contact 415 and the substrate or printed wiring board on which the header 400 is mounted.

Figure 4B:
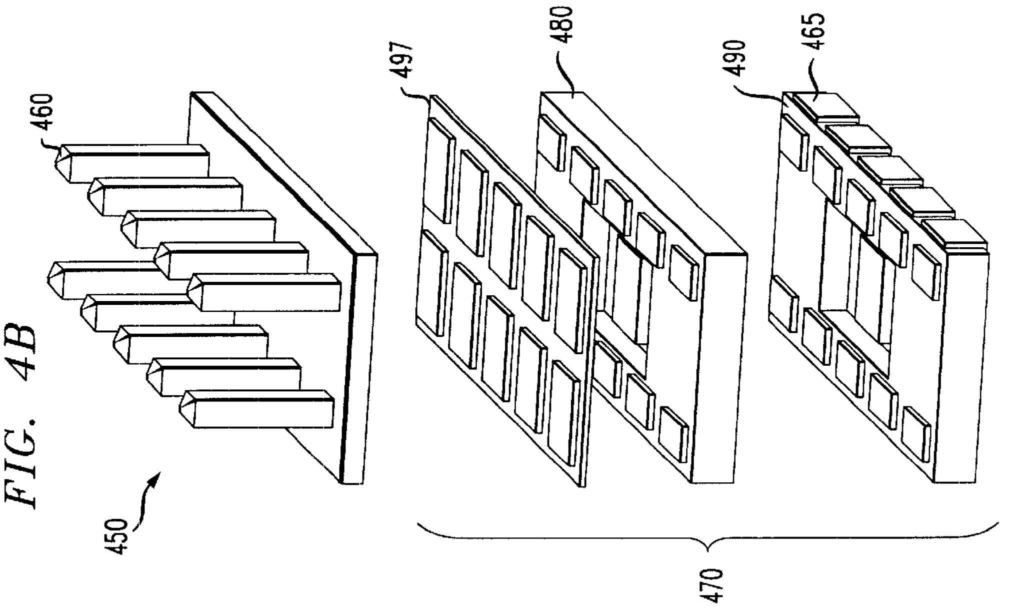
FIG. 4B illustrates an exploded isometric view of yet another embodiment of a header constructed in accordance with the principles of the present invention.

Turning to FIG. 4B, illustrated is an exploded isometric view of yet another embodiment of a header 450 constructed in accordance with the principles of the present invention. The header 450 is analogous to the header 400 illustrated and described with respect to FIG. 4A and includes a plurality of first contacts (one of which is designated and hereinafter referred to as a first contact 460), a plurality of second contacts (one of which is designated and hereinafter referred to as a second contact 465) and an intermediate body 470. The intermediate body 470 has a first insulated section 480 directly coupled to a second insulated section 490. In the illustrated embodiment, the intermediate body 470 further has an intermediate layer 497 coupled between the first insulated section 480 and the first contacts 460. This is but one of many configurations that may be employed to couple or cascade a number of insulated sections to accommodate complex signal processing and conditioning in the header 450.

Those skilled in the pertinent art will readily understand that the intermediate body of the present invention can have any one of a number of possible configurations and still be well within the broad scope of the present invention. For example, the scope of the present invention clearly would cover a header wherein the entire intermediate body consists of a single insulated section as well as a header with an intermediate body having several insulated sections or intermediate layers.

Figure 5:
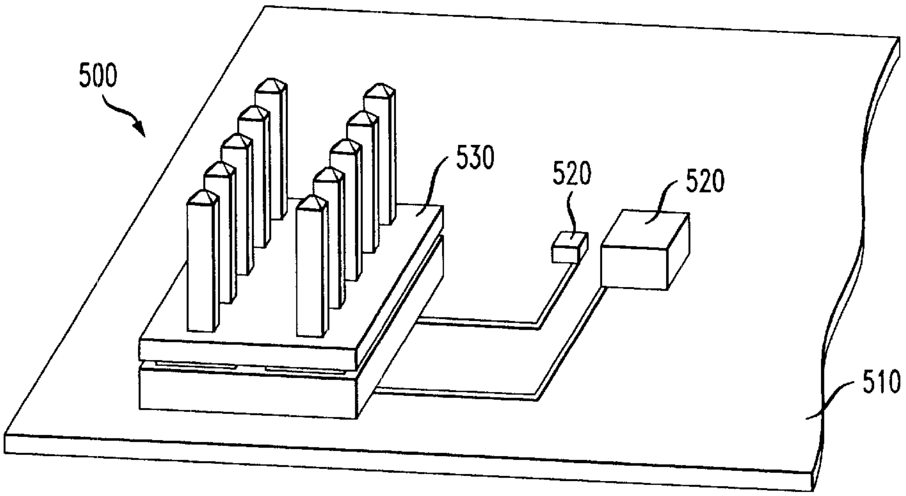
FIG. 5 illustrates an isometric view of a portion of an embodiment of an electronic device constructed in accordance with the principles of the present invention.

Turning to FIG. 5, illustrated is an isometric view of a portion of an embodiment of an electronic device 500 constructed in accordance with the principles of the present invention. The electronic device 500 includes a substrate (e.g., a printed wiring board) 510 adapted to receive electronic components 520 thereon. The electronic device 500 further includes a header 530 mounted on the substrate 510. The header 530 can be in any of the configurations described herein and be well within the scope of the present invention. The header 530 advantageously conditions a signal passing through at least a portion thereof to reduce an amount of real estate required on the substrate 510 that would otherwise be required by discrete signal conditioning components.

Figure 6:
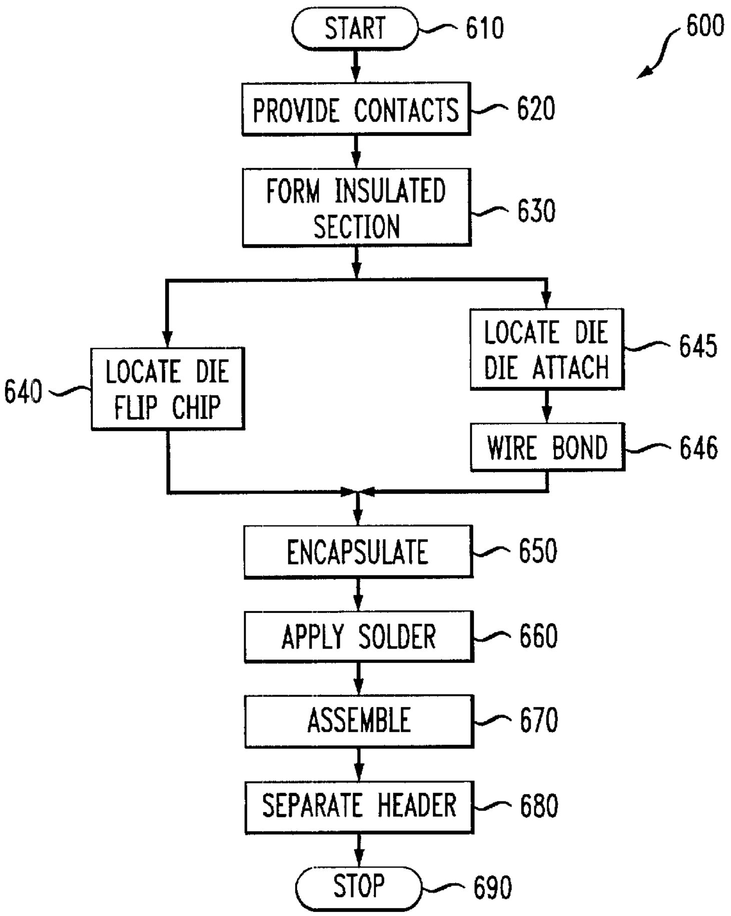
FIG. 6 illustrates a flow diagram of an embodiment of a method of manufacturing a header constructed in accordance with the principles of the present invention.

Turning now to FIG. 6, illustrated is a flow chart depicting an embodiment of a method 600 of manufacturing a header in accordance with the principles of the present invention. The method commences with a start step 610. In a provide contacts step 620, a plurality of first and second contacts are provided. The first and second contacts may be surface mount pads, spring loaded connectors, through hole connectors or any other type of connectors. The first contacts are provided on a first layer of an intermediate body, while the second contacts are provided on a second layer of the intermediate body. In the illustrated embodiment, the first and second layers of the intermediate body are manufactured in panel form, wherein a single panel may produce a plurality of individual headers.

In a form insulated section step 630, an insulated section of the intermediate body is formed. The insulated section has a cavity therein adapted to receive a semiconductor die. Then, in a first locate die step 640, the semiconductor die is located in the cavity using flip-chip mounting methods. Alternatively, in a second locate die step 645, the semiconductor die may be die-attached in the cavity. If the semiconductor die is die-attached, a wire bond step 646 is then employed to connect the various inputs and outputs of the semiconductor die to the first and second contacts. Of course, any method employed to locate the semiconductor die in the cavity is within the scope of the present invention.

Then, in a encapsulate step 650, the cavity is filled with an encapsulant to protect the semiconductor die. Next, in an apply solder step 660, solder paste is applied to the internal contact surfaces of the first and second layers and the insulated section. Then, in an assemble step 670, the first and second layers and the insulated section are assembled in a fixture and reflow soldered. Finally, in a separate header step 680, each header may be separated from the panel and packaged in tape and reel form. The method ends at a stop step 690.

Although the present invention has been described in detail, those skilled in the art should understand that they can make various changes, substitutions and alterations herein without departing from the spirit and scope of the invention in its broadest form.

What is claimed is:

1. A header, comprising:

a first plurality of contacts arranged to form a cable connector;

a second plurality of contacts arranged to form a surface mountable connector; and an intermediate body, including:

an insulated section interposed between said first and second pluralities of contacts and having a cavity therein, and a semiconductor die, located within said cavity and interconnecting said first and second pluralities of contacts, adapted to condition a signal passing between said cable connector and said surface mountable connector.

2. The header as recited in claim 1 wherein a plurality of semiconductor dies are located within said cavity.

3. The header as recited in claim 1 wherein said semiconductor die is flip-chip mounted in said cavity.

4. The header as recited in claim 1 wherein said semiconductor die is die-attached and wire-bonded in said cavity.

5. The header as recited in claim 1 wherein said intermediate body further comprises a second insulated section couplable to said insulated section.

6. The header as recited in claim 1 wherein at least one of said first plurality of contacts is a spring loaded connector.

7. The header as recited in claim 1 wherein a pitch of said first plurality of contacts varies from a pitch of said second plurality of contacts.

8. A method of manufacturing a header, comprising:

providing a first plurality of contacts arranged to form a cable connector;

arranging a second plurality of contacts to form a surface mountable connector; and forming an intermediate body, including:

forming an insulated section interposed between said first and second pluralities of contacts and having a cavity therein, and locating a semiconductor die within said cavity and interconnecting said first and second pluralities of contacts, adapted to condition a signal passing between said cable connector and said mountable connector.

9. The method of manufacturing as recited in claim 8 wherein said locating comprises locating a plurality of semiconductor dies within said cavity.

10. The method of manufacturing as recited in claim 8 wherein said locating comprises flip-chip mounting said semiconductor die in said cavity.

11. The method of manufacturing as recited in claim 8 wherein said locating comprises die-attaching and wire-bonding said semiconductor die in said cavity.

12. The method of manufacturing as recited in claim 8 wherein said forming comprises forming a second insulated section couplable to said insulated section.

13. The method of manufacturing as recited in claim 8 wherein at least one of said first plurality of contacts is a spring loaded connector.

14. The method of manufacturing as recited in claim 8 wherein a pitch of said first plurality of contacts varies from a pitch of said second plurality of contacts.

15. An electronic device, comprising:

a substrate adapted to receive electronic components; and a header, coupled to said substrate, that provides electrical interconnectivity within said electronic device, including:

a first plurality of contacts arranged to form a cable connector;

a second plurality of contacts arranged to form a surface mountable connector; and an intermediate body, including:

an insulated section interposed between said first and second pluralities of contacts and having a cavity therein, and a semiconductor die, located within said cavity and interconnecting said first and second pluralities of contacts, adapted to condition a signal passing between said cable connector and said surface mountable connector.

16. The electronic device as recited in claim 15 wherein a plurality of semiconductor dies are located within said cavity.

17. The electronic device as recited in claim 15 wherein said semiconductor die is flip-chip mounted in said cavity.

18. The electronic device as recited in claim 15 wherein said semiconductor die is die-attached and wire-bonded in said cavity.

19. The electronic device as recited in claim 15 wherein said intermediate body further comprises a plurality of insulated sections coupled to said insulated section.

20. The electronic device as recited in claim 15 wherein at lest one of said first plurality of contacts is a spring loaded connector.

21. The electronic device as recited in claim 15 wherein a pitch of said first plurality of contacts varies from a pitch of said second plurality of contacts.

* * * * *